United States Patent [19]

Yoshida et al.

[11] Patent Number: 5,371,044
[45] Date of Patent: Dec. 6, 1994

[54] METHOD OF UNIFORMLY ENCAPSULATING SEMICONDUCTOR A DEVICE IN RESIN

[75] Inventors: Isamu Yoshida; Junichi Saeki, both of Yokohama; Shigeharu Tsunoda, Fujisawa; Kunihiko Nishi, Kokubunji; Ichiro Anjoh; Kenichi Imura, both of Koganei; Toshihiro Yasuhara, Kodaira; Junichi Arita, Musashino; Kazuhiro Sugino, Yokohama, all of Japan

[73] Assignee: Hitachi, Ltd., Tokyo, Japan

[21] Appl. No.: 876,349

[22] Filed: Apr. 30, 1992

[30] Foreign Application Priority Data

May 27, 1991 [JP] Japan ................... 3-120912

[51] Int. Cl.5 ............. H01L 21/56; H01L 21/58; H01L 21/60
[52] U.S. Cl. .................. 437/214; 437/220; 264/272.17; 257/667
[58] Field of Search ............. 437/207, 214, 220; 264/272.17; 257/667, 774, 671

[56] References Cited

U.S. PATENT DOCUMENTS

| | | | |
|---|---|---|---|
| 4,641,418 | 2/1987 | Meddles | 264/272.17 |
| 4,894,704 | 1/1990 | Endo | 257/667 |
| 5,018,003 | 5/1991 | Yasunaga et al. | 257/695 |
| 5,086,018 | 2/1992 | Conru | 437/207 |

FOREIGN PATENT DOCUMENTS

| | | | |
|---|---|---|---|
| 54-33663 | 3/1979 | Japan | 264/272.17 |
| 55-120153 | 9/1980 | Japan | . |
| 56-43854 | 10/1981 | Japan | 264/272.17 |
| 59-219948 | 12/1984 | Japan | 257/667 |
| 60-154546 | 8/1985 | Japan | . |
| 60-200552 | 10/1985 | Japan | . |
| 61-4234 | 1/1986 | Japan | 264/272.17 |
| 63-265454 | 11/1988 | Japan | 257/667 |
| 1268159 | 10/1989 | Japan | 437/214 |
| 29142 | 1/1990 | Japan | 264/272.17 |
| 2134835 | 5/1990 | Japan | 264/272.17 |
| 2186647 | 7/1990 | Japan | 264/272.17 |
| 39554 | 1/1991 | Japan | 257/667 |
| 360049 | 3/1991 | Japan | 437/211 |
| 394432 | 4/1991 | Japan | 264/272.17 |

OTHER PUBLICATIONS

Japanese Patent Unexamined Publication No. 60-154546.
Japanese Patent Unexamined Publication No. 60-200552.

Primary Examiner—Olik Chaudhuri
Assistant Examiner—David E. Graybill
Attorney, Agent, or Firm—Antonelli, Terry, Stout & Kraus

[57] ABSTRACT

A molding method in which a control plate having a size which is equal to or larger than the width of the outlet port of a supply passage are disposed in a cavity adjacent to the resin supply passage of a mold and thereby, the resin molding can be effected substantially equally at upper and lower sides of the insert comprising a semiconductor device and a lead.

20 Claims, 9 Drawing Sheets

METHOD OF UNIFORMLY ENCAPSULATING SEMICONDUCTOR A DEVICE IN RESIN

BACKGROUND OF THE INVENTION

The present invention relates to a method of enclosing semiconductor devices in a resin material, and, more particularly to a method of enclosing semiconductor devices in a resin material by molding, a lead frame for use only in practicing this method, and a semiconductor apparatus enclosed in a resin enclosure package, which can be manufactured by this method.

There has been known a semiconductor apparatus formed by hermetically enclosing semiconductor devices in a resin material (which is usually a thermosetting resin). The semiconductor apparatus of the type described above is formed by covering with the resin the semiconductor devices and a lead frame for supporting the semiconductor devices.

The method of enclosing the semiconductor devices in the resin will now be schematically described. A typical lead frame has base frames formed on the two sides thereof, a land (or a tab) on which the semiconductor devices are mounted and a multiplicity of leads. In order to obtain a plurality of products by cutting to separate the lead frame after it has been covered with a resin, the lead frame is formed as a single plate. The typical single plate is a member formed into an elongated rectangular shape having a plurality of integrally connected unit pieces each of which has a land and a multiplicity of leads formed by punching or etching. The semiconductor devices are usually placed on the lands of the lead frame and each of the semiconductor devices and a multiplicity of the corresponding leads are connected to one another by gold wires. The lead frame with the semiconductor devices is set between an upper mold half and a lower mold half (or upper and lower die halves). Although the structure of the mold has been known, it will be described later. Then, the resin is injected into each of the cavities defined by the upper and the lower mold halves through each gate, so that the upper and the lower surfaces of the lead frame including the semiconductor devices is covered with the molded resin. The molded resin is in the form of a plurality of blocks which cover each semiconductor device and each lead frame. The base frames of the lead frame, and a portion of the lead (outer lead), are not covered with the resin, and the base frames and the tie bars are removed by cutting. Furthermore, the lead frame is cut at each connecting part between the adjacent resin blocks, so that a plurality of semiconductor apparatuses can be obtained.

A technology for overcoming a problem arising when the aforesaid molding operation is performed has been disclosed in, for example, JP-B-56-43854, in which a method has been suggested which is capable of excluding voids which will be generated in the surface layer of the molded resin near the mold gate. In this method, a frame plate (that is, a projecting plate extending from the lead frame) having a bent leading portion and just like covering the outlet port of the gate is formed from the lead frame positioned adjacent to the outlet port of the gate. The bent frame plate forcibly changes the flow of the resin supplied into the cavity through the gate or causes the resin flow to collide with the inner lead, so that the flow direction is forcibly changed.

Another method of reducing the aforesaid voids has been disclosed in JP-A-60-200552, in which an additional lead is formed to project over the inner lead positioned adjacent to the gate. According to JP-A-60-200552, the resin introduced into the cavity through the gate collides with the additional lead, so that the flow of the resin is forcibly changed.

A technology relating to the shape of the lead frame has been disclosed in JP-A-60-154546. The technology disclosed in JP-A-60-154546 is capable of preventing a phenomenon of generation of a gap between the lead and the resin when the lead is undesirably extended by a tension acting on the lead which supports the land when unnecessary portions (namely the base frames and the tie bars) are removed by cutting after the resin molding process has been completed, moisture resistance of the semiconductor apparatus deteriorating due to the gap. According to JP-A-60-154546, the projection is formed on the lead which supports the land, so that the separation of the lead from the resin is prevented.

With the tendency of reducing the thickness of the semiconductor apparatus, the constraint conditions such as the weight of gold wire loops, the thickness of the semiconductor device, the thickness of the lead frame and the minimum thickness of the resin on the semiconductor device required to prevent an influence of light exerted on the semiconductor device cause arise a problem that the thickness of each resin layer covering the upper and the lower surfaces of an insert, which comprises a semiconductor device and inner leads, cannot be equalized. In other words, if the resin layers have the same thickness, the thickness of the semiconductor apparatus cannot be reduced. Therefore, the resin flow rate on the insert and under the insert become unbalanced. As a result, there arises a problem of an imperfect filling of resin in the mold cavity, generation of undesirable through-hole voids in the molded resin and of a deviation of the insert.

That is, the conventional technologies have no means which is capable of making the flows of the resin for respectively forming the upper and the lower resin layers to be substantially the same at the time of the molding operation in a case where the thickness of the resin layer above the insert and that of the resin layer under the insert are not the same.

SUMMARY OF THE INVENTION

Thus, an object of the present invention is to suppress molding defects such as an imperfect filling of resin in a mold cavity, generation of through-hole the molding resin and deflection of an insert even if the thickness of the resin layer on the insert and that under the insert are not the same at the time of enclosing semiconductor devices in the resin by molding.

According to a first aspect of the present invention, in a method of enclosing a semiconductor device in resin comprising steps of placing a lead frame on which a semiconductor device is mounted between upper and lower mold halves which constitute a mold and injecting, under pressure, resin fluidized with heat into a cavity defined by the two mold halves through a supply passage formed in the mold, so that the upper and the lower surfaces of an insert including the lead frame and the semiconductor device connected to the lead frame with wires are covered with the resin, wherein the following lead frame is used: the lead frame has at least one control plate to control the flow of the resin, the control plate is arranged in a mold cavity at a position adjacent to an outlet port (or a gate) of the supply passage, and is formed along a flat surface of the lead frame in a state where the lead frame is placed between the upper and lower mold halves.

The control plate is provided in any one of the following forms:

(a) a projection formed integrally with base frames of the lead frame;
(b) a projection formed integrally with a land holding lead which integrally connects a land of the lead frame for supporting the semiconductor device with the base frames and thereby holds the land;
(c) a projection formed integrally with an inner lead positioned adjacent to the outlet port of a supply passage; and
(d) a sheet member applied along a plurality of inner leads in the vicinity of the outlet port of the supply passage.

When molding is effected, the control plate is biased to either of an upper or a lower level with respect to an axis of the outlet port of the supply passage so as to make a flow passing along the surface of the ceiling of the cavity and another flow passing along the surface of the bottom of the cavity to substantially equally move forward. In the case where the control plate is biased to either of the upper or the lower level with respect to an axis of the outlet port of the supply passage to make a flow passing along the surface of the ceiling of the cavity and another flow passing along the surface of the bottom of the cavity to substantially equally move forward, the resin flow is restricted at the side to which the control plate is biased and the flow is promoted at the other side. The aforesaid control of the resin flow is also effected by making the flow to receive a throttle action at a position between the control plate and another portion of the insert positioned in the cavity.

According to another aspect of the present invention, assuming that the interval between the top end of the insert, having the semiconductor device positioned on the upper surface of the lead frame placed between the upper and the lower mold halves, and the surface of the ceiling of the cavity is a and the interval between the lower end of the insert and the bottom surface of the cavity is b, a relationship of a>b is set and the control plate is biased to the axis of the outlet port of the supply passage.

It is recommended that the width of the control plate in a horizontal direction perpendicular to the axis of the supply passage is made to be equal to or larger than the width of the outlet port of the supply passage so that the resin flow can be made further effective.

According to a second aspect of the present invention, there is provided a lead frame with the control plate or the sheet member which can be understood from the aforesaid method.

According to a third aspect of the present invention, there is provided a semiconductor apparatus which can be obtained by the aforesaid method.

Other and further objects, features and advantages of the invention will be appear more fully from the following description.

DETAILED DESCRIPTION OF THE INVENTION

Figure 1:
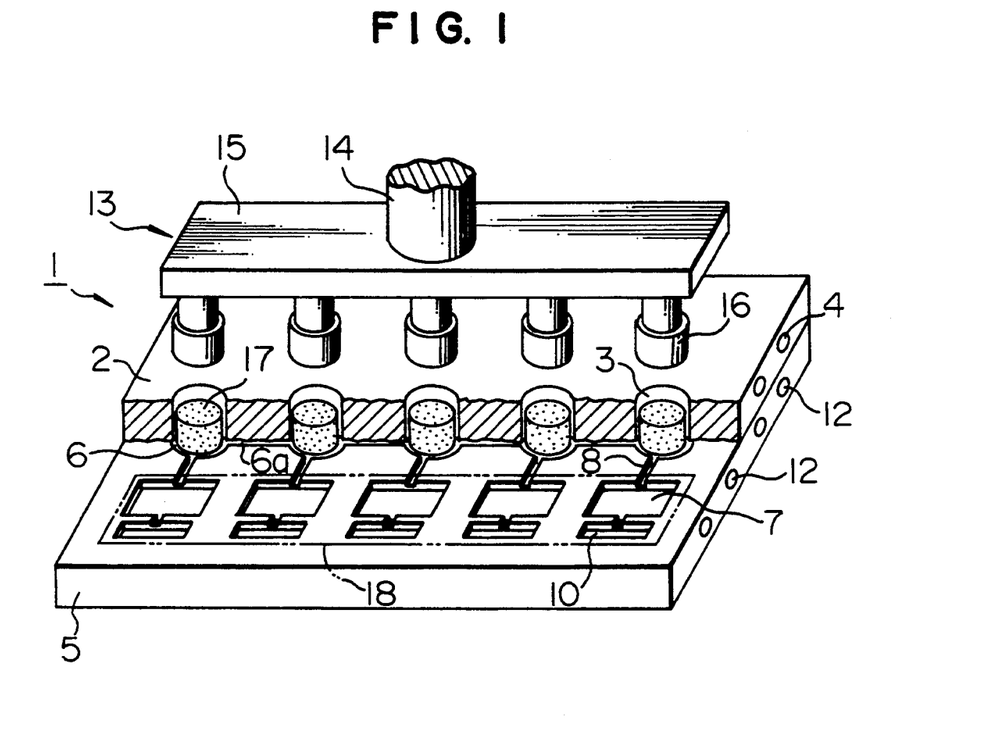
FIG. 1 is a schematic view which illustrates an embodiment of a molding apparatus according to the present invention.
Figure 2:
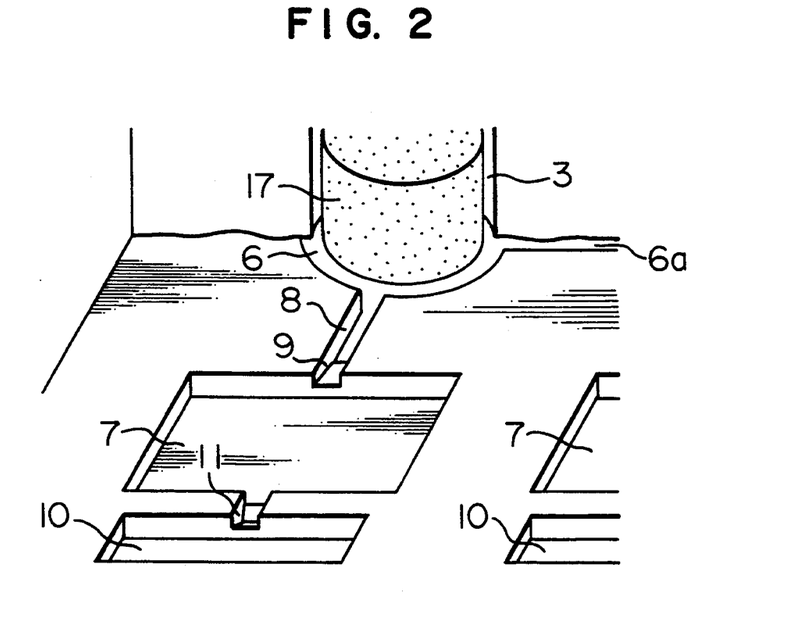
FIG. 2 is an enlarged view which illustrates a local portion of FIG. 1.

FIG. 1 illustrates an embodiment of a molding apparatus 1 according to the present invention. FIG. 2 is an enlarged view which illustrates a portion shown in FIG. 1. The molding apparatus 1 includes an upper mold half 2, a lower mold half 5 and a plunger device 13. The upper mold half 2 has a plurality of through-holes 3 formed therein, the through-holes 3 being used to serve as pots which receive resin blocks 17 (called "tablet") charged thereto. The upper mold 2 has a plurality of heater insertion holes 4 formed perpendicular to the axes of the through-holes 3. The lower mold half 5 has, on the top surface thereof, a plurality of recesses 6 formed to respectively correspond to the through-holes 3, connecting passages 6a for allowing all of the recesses 6 to connect with one another, a plurality of rectangular cavities 7, a plurality of connecting grooves that are resin supply passages 8 for allowing the recesses 6 and the cavities 7 to connect with one another, a plurality of vent cavities 10 respectively corresponding to the supply passages 8 and a plurality of second connecting grooves 11 respectively allowing the cavities 7 and the vent cavities 10 to connect with one another. An outlet region of the supply passage 8, that is a region just before the position at which a resin flowing in the supply passage 8 is introduced into the cavity 7, is usually called a first gate 9, and the connecting groove 11 is called a second gate. The residual portion of the supply passage 8 except for the gate 9 is called a runner. Similarly to the upper mold half 2, the lower mold half 5 has a plurality of heater insertion holes 12. Furthermore, the molding apparatus 1 has a plunger device 13. The plunger device 13 includes a rod 14 connected to a power source, a rigid plate 15 secured to the lower end of the rod 14 and a plurality of plungers 16 each of which is secured to the lower surface of the rigid plate 15.

In the resin molding process, a lead frame 18 described in the introduction of this specification and formed by providing a plurality of unit pieces is placed as shown in FIG. 1. The lead frame 18, of course, has a plurality of semiconductor devices, which are connected to the leads of the lead frame 18 by gold wires, on the surface thereof. These elements, as a whole, form a member called an "insert" as described above. In this state, the upper mold half 2 is brought into contact with the top surface of the lower mold half 5. The resin (for example, an epoxy resin) blocks, that are the tablets 17, are charged into the through-holes 3. Then, the plunger device 13 is moved downwards, so that plungers 16 are respectively inserted into the through-holes 3, and the charged resin blocks 17, which have been fluidly plasticized by heat, are pressed by the plungers 16. The pressurized resin flows through the supply passage 8 before it is introduced into each cavity 7 to flow along the top and the lower surfaces of the insert. As a result, the resin covers the insert. The resin flow in the mold will be clearly understood from FIGS. 4A to 4E (the invention process) and FIGS. 4F and 4G (a conventional process). As shown in these drawings, the resin is introduced from a supply passage located in the left portion of the drawings into the cavity and finally the cavity is perfectly filled with the resin.

The resin flow, which has filled the cavity 7, is introduced into the vent cavity 10 via the connecting groove 11. The vent cavity 10 prevents the resin from generation of unfilled spaces in the cavity 7.

Figure 5:
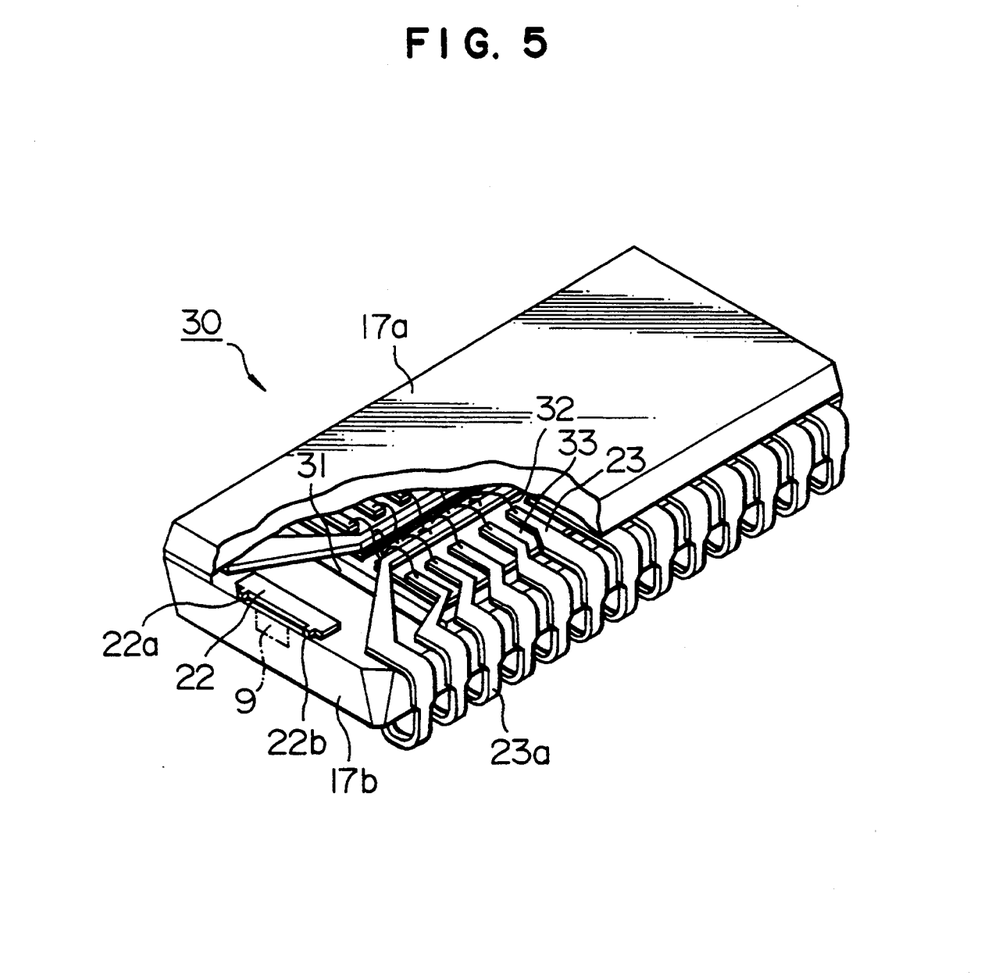
FIG. 5 is a perspective view which illustrates, with portions broken away, a local portion of an example of a semiconductor apparatus using a lead frame with no land, manufactured by the method according to the present invention.

The molding resin and the insert covered with the resin are ejected by separating the upper and the lower mold halves 2 and 5 from each other after the resin has been cured. An intermediate product thus obtained is then subject to a process in which the resin filling the supply passages 8, the connecting grooves 11 and the vent cavities 10 is removed by cutting, and the base frames of the lead frame 18 are also removed by cutting. Furthermore, the lead frame 18 is cut at intermediate positions between adjacent semiconductor devices. As a result, a plurality of resin sealed semiconductor apparatuses are obtained as products. An example of the semiconductor apparatus thus manufactured is shown in FIG. 5. FIG. 5 illustrates, with a portion of the resin broken away, a semiconductor apparatus 30 whose lead frame has no land to clarify the state of its inner portion. The semiconductor apparatus 30 has outer leads 23a bent toward the lower surface of the apparatus 30.

Figure 3:
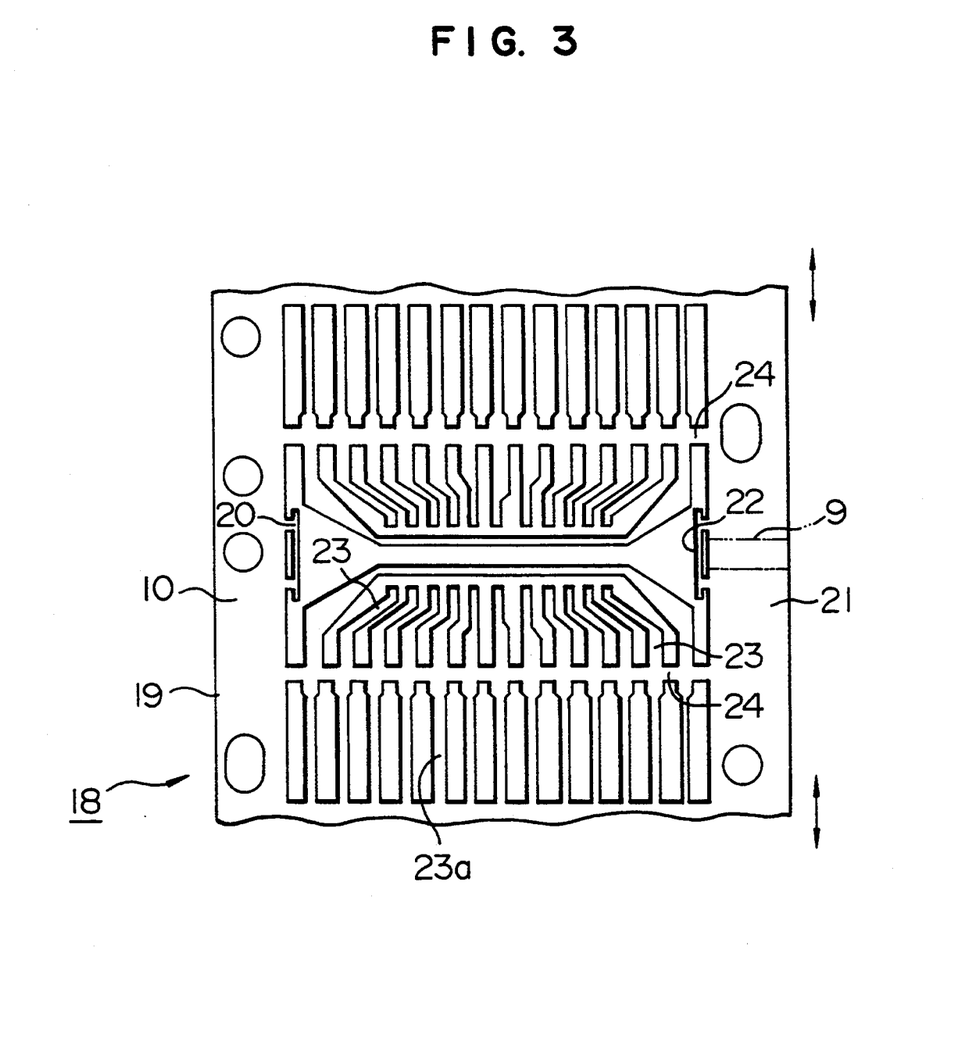
FIG. 3 is a partial view which illustrates an example of a lead frame with no land according to the present invention.

In the present invention, an electrically conductive metal lead frame 18 with no land arranged, for example as shown in FIG. 3, is used. Although FIG. 3 illustrates only a unit lead frame, the unit piece is a part of a multiple connected member with a plurality of unit pieces (see arrows in FIG. 3). The lead frame 18 has base frames 19 and 21, a multiplicity of leads 23, and a pair of tie bars 24 extending to traverse the lead frame 18. A semiconductor device is positioned on the surface of a region between the base frames 19 and 21 and between the pair of the tie bars 24. Although the pair of the tie bars 24 are removed from the final product by cutting, they act to prevent the undesirable outward flow of the resin from a portion between adjacent leads during the molding process. The base frame 21 is placed on a gate 9 of the lower mold half during the molding process. FIG. 3 illustrates the corresponding gate 9 by phantom lines. The lead frame 18 has, on the axis of the supply passage 8 or gate 9, plates, that is, control plates 20 and 22 which respectively inwards project inwardly and extend from the inner edges of the base frames 19 and 21 in parallel to the surface of the lead frame 18. The widthwise center line of the control plate 22 is on the axis of the gate 9 and the width of the control plate 22 is formed to be equal to or larger than the horizontal width of the gate 9. The control plates 20 and 22 are provided for the purpose of controlling the resin flow during the molding process. After the molding process has been completed, the lead frame is processed in such a manner that each tie bar 24 and the front portion of each lead are removed by cutting and the outer leads 23a are bent. At this time, the state of connection between the base frames 19, 21 and the resin portion is maintained by the control plates 20 and 22.

Figure 4A:
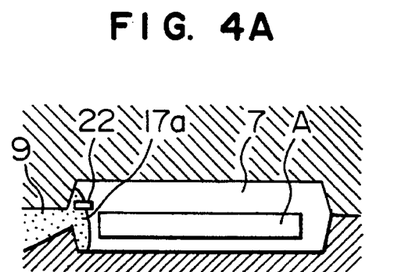
FIG. 4A, in cooperation with FIGS. 4B to 4E, sequentially illustrates a resin flow in a mold cavity taking place during a resin molding process according to a method of the present invention.
Figure 4B:
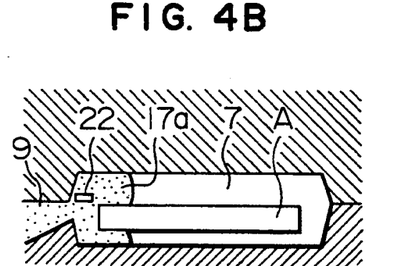
FIG. 4B, in cooperation with FIGS. 4A and 4C to 4E, sequentially illustrates the resin flow in the mold cavity taking place during the resin molding process according to the method of the present invention.
Figure 4C:
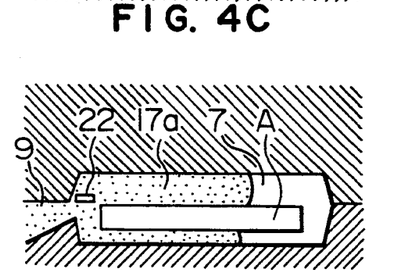
FIG. 4C, in cooperation with FIGS. 4A, 4B, 4D and 4E, sequentially illustrates the resin flow in the mold cavity taking place during the resin molding process according to the method of the present invention.
Figure 4D:
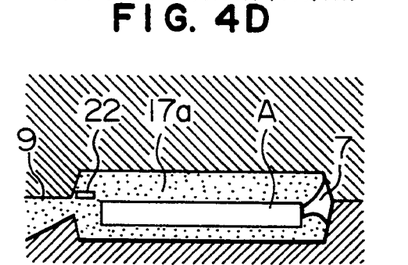
FIG. 4D, in cooperation with FIGS. 4A to 4C and 4E, sequentially illustrates the resin flow in the mold cavity taking place during the resin molding process according to the method of the present invention.
Figure 4E:
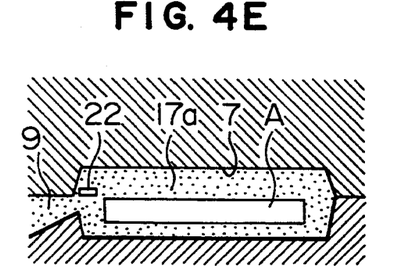
FIG. 4E, in cooperation with FIGS. 4A to 4D, sequentially illustrates the resin flow in the mold cavity taking place during the resin molding process according to the method of the present invention.
Figure 4F:
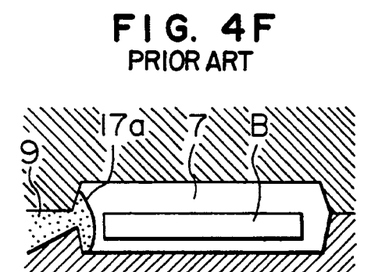
FIG. 4F, in cooperation with FIGS. 4G to 4J, sequentially illustrates the resin flow in the mold cavity taking place during the resin molding process according to the method of the present invention.
Figure 4G:
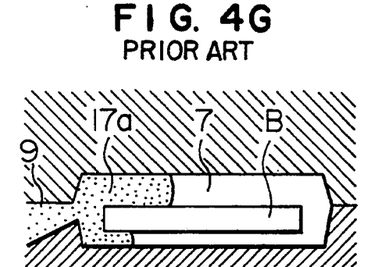
FIG. 4G, in cooperation with FIGS. 4F and 4H to 4J, sequentially illustrates a resin flow in a mold cavity taken place during a resin molding process according to a conventional method to compare with the method according to the present invention.
Figure 4H:
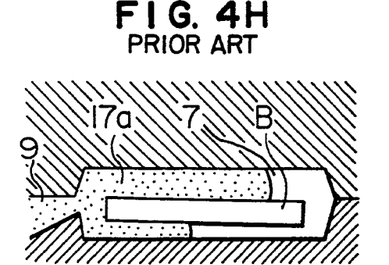
FIG. 4H, in cooperation with FIGS. 4F, 4G, 4I and 4J, sequentially illustrates the resin flow in the mold cavity taking place during the resin molding process according to the conventional method to compare with the method according to the present invention.
Figure 4I:
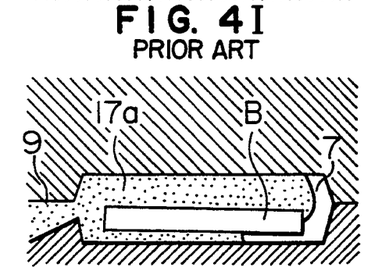
FIG. 4I, in cooperation with FIGS. 4F to 4H and 4J, sequentially illustrates the resin flow in the mold cavity taking place during the molding process according to the conventional method, to compare with the method according to the present invention.
Figure 4J:
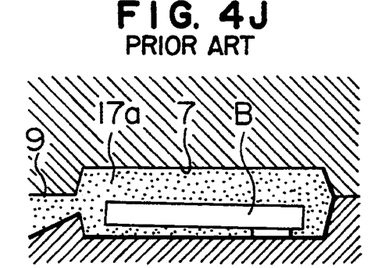
FIG. 4J, in cooperation with FIGS. 4F to 4I, sequentially illustrates the resin flow in the mold cavity taking place at the time of the resin molding process according to the conventional method, to compare with the method according to the present invention.

The effect obtainable from the control plates 20 and 22 will now be described with reference to FIGS. 4A to 4E (the invention process) and FIGS. 4F to 4G (a conventional process). First, in a case where a conventional insert B is used as shown in FIGS. 4F to 4G, the insert B is set to a position biased to the lower portion in the cavity 7. The reason why the insert B is set as described above is that the resin layer covering the upper surface of the semiconductor device must have a sufficient thickness. Therefore, a resin 17a introduced into the cavity 7 easily and quickly flows through the upper space having small resistance, while the same slowly flows through the lower space. FIGS. 4F to 4G sequentially illustrate the aforesaid states. As a result, the pressure in the upper space of the insert B and that in the lower space become imbalanced, so that the insert B is excessively biased to approach the bottom surface of the cavity 7 and the resin starvation portion or voids can easily be generated. The semiconductor apparatus thus obtained is a rejected product.

On the other hand, in a state shown in FIGS. 4A to 4E, an insert A including a lead frame having the control plate 22 is set to a position biased to a lower portion in the cavity 7. Although the space above the insert A is larger than the lower space, also in this case, the control plate 22 is positioned adjacent to the gate 9 of the supply passage 8 while being biased upwards, so that the flow of the resin toward the upper space is controlled and thereby the resin introduction speed into the upper space and that into the lower portion are balanced with each other. As a result, the resin flows in the upper and the lower spaces while being substantially balanced with each other as sequentially shown in FIGS. 4A to 4E, so that the resin charging in the upper space and that in the lower space can be completed at substantially the same time. The control plate 20 is positioned to align to the aforesaid connecting groove 11. Consequently, even if the thicknesses of the resin layers respectively covering the upper and the lower surfaces of the insert are not the same, there can be obtained a semiconductor apparatus freed from defects, such as biasing of the insert and voids in the resin taking place in the molding process.

As an example of the semiconductor apparatus thus manufactured, the semiconductor apparatus 30 is shown in FIG. 5. The semiconductor apparatus 30 is a package formed by enclosing an insert including the semiconductor device 31 and a lead frame in a space between resins 17a and 17b. As shown in FIG. 5, the base frames 19 and 21 and the tie bar 24 (see FIG. 3) have been removed by cutting. The control plate 22 of the lead frame is left while being held between the resins 17a and 17b and it exists at a gate 9 position which is indicated by phantom lines. The position of the gate 9 can easily be detected from a cutting trace of the removal of the resins left in the gate 9 by cutting performed after the molding process has been completed. The semiconductor device 31 is set along the lower surface of the multiple leads 23 via an insulator sheet 33 and is electrically connected to the upper surface of the multiple leads 23 by a plurality of wires 32.

Furthermore, two cut surface portions 22a and 22b realized by cutting the control plate 22 from the material lead frame can be visibly confirmed from outside.

Figure 6:
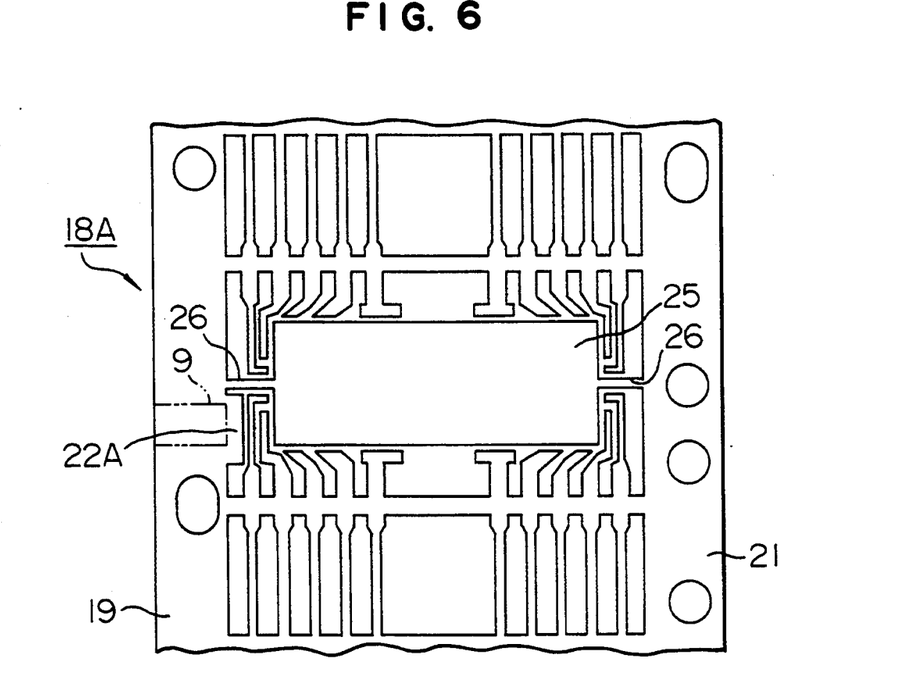
FIG. 6 is a partial view which illustrates another example of the lead frame according to the present invention.

FIG. 6 illustrates a lead frame 18A as a modification. Referring to FIG. 6, reference numeral 25 represents a land on which the semiconductor device (omitted from illustration) is mounted and 26 represents land support leads for establishing connection between the land 25 and the base frames 19 and 21. A control plate 22A is projected from the base frame 19 and has a size larger than the horizontal width of the gate 9. The aforesaid control plate 22A and the land 25 form a throttle portion acting to control the resin flows above and below the insert such that these flows are substantially the same.

Figure 7:
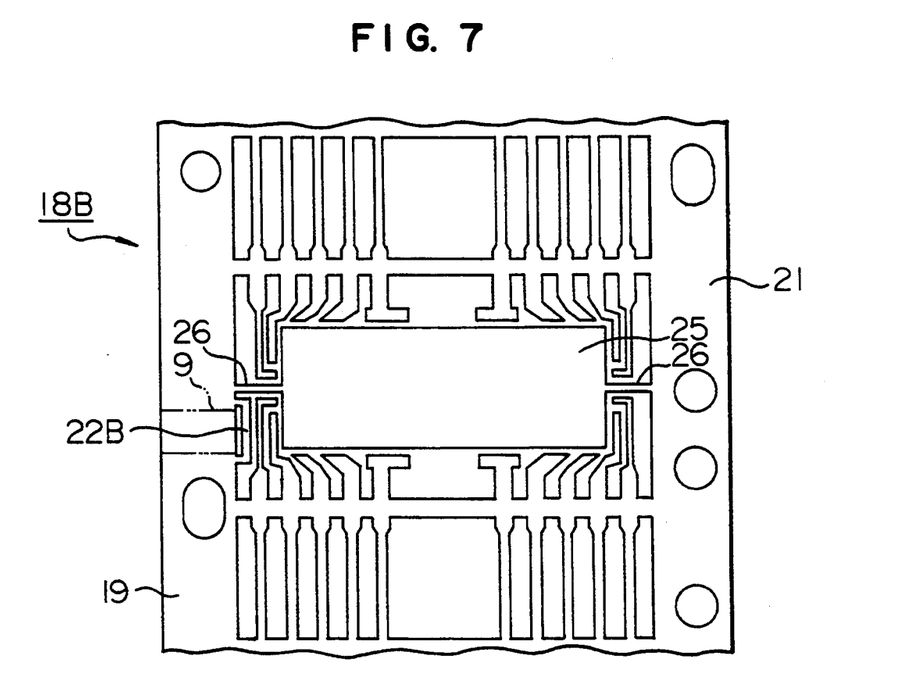
FIG. 7 is a partial view which illustrates another example of the lead frame according to the present invention.

FIG. 7 illustrates a lead frame 18B as another modification. The difference from the structures respectively shown in FIG. 5 and FIG. 6 lies in that a control plate 22B and the base frame 19 are connected to each other at two small portions and thereby the area for coupling them is reduced. Since the area for coupling them is reduced in this lead frame 18B in comparison with the structure shown in FIG. 6, an operation of cutting the base frame 19 from the semiconductor apparatus can easily be effected. Furthermore, since the area of a portion of the control plate 22B of the semiconductor apparatus which appears outside is sufficiently small to reduce the passage through which water is undesirably introduced, an effect can be obtained in that the moisture resistance can be improved.

Figure 8:
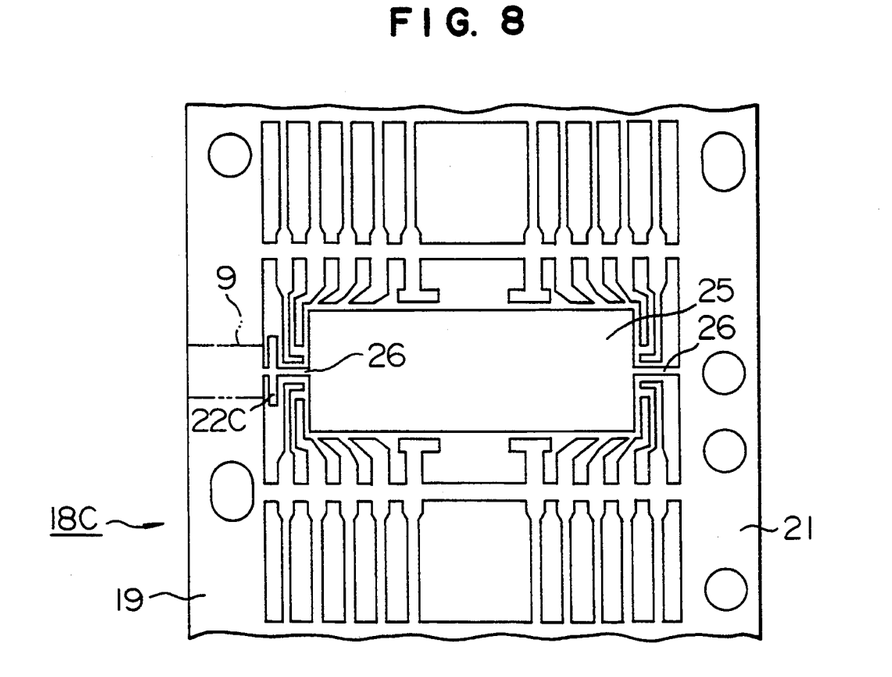
FIG. 8 is a partial view which illustrates another example of the lead frame according to the present invention.

FIG. 8 illustrates a lead frame 18C as another modification. In comparison with the structures shown in FIGS. 6 and 7 in which the gate 9 is biased from the center of the short side of the semiconductor apparatus, the lead frame 18C according to this modification has the gate 9 which is located at the center of the short side of the apparatus and a control plate 22C is projected from the land support lead 26.

Since the lead frame 18C shown in FIG. 8 has the control plate 22C which does not appear outside in the wall of apparatus and thereby the passage through which water is undesirably introduced can be reduced in size, an effect can be obtained in that the moisture resistance of the apparatus can be improved in comparison with the modification shown in FIG. 6.

Figure 9:
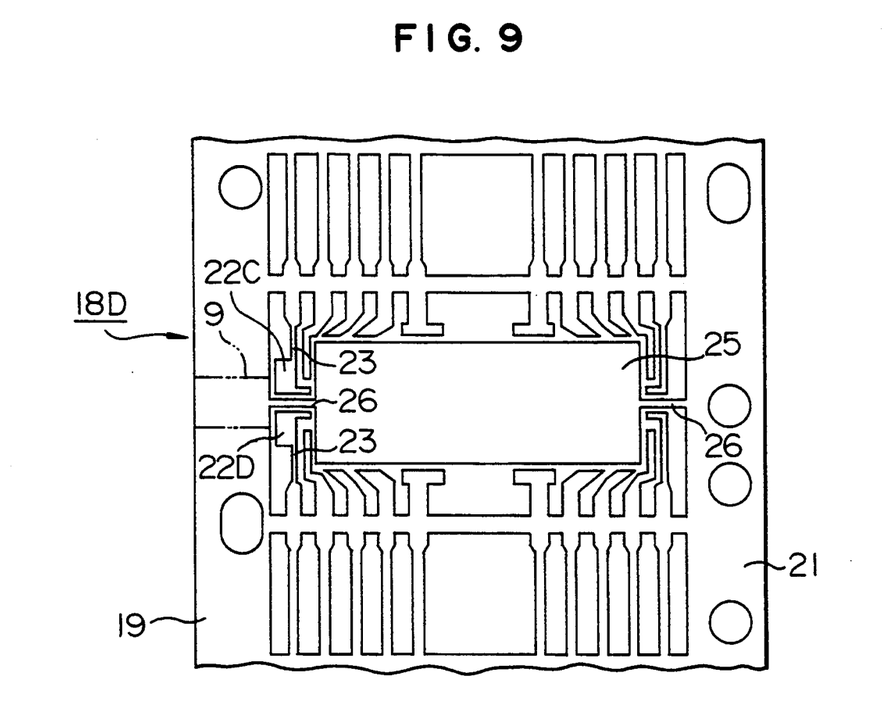
FIG. 9 is a partial view which illustrates another example of the lead frame according to the present invention.

FIG. 9 illustrates a lead frame 18D as another modification. The lead frame 18D is different from the lead frame 18C shown in FIG. 8 in that control plates 22D are not projected over the land support leads 26 and the control plates 22D are projected from the leads 23.

In the modification shown in FIG. 9, the control plates 22D do not appear in the wall of the apparatus and thereby the passage through which water is undesirably introduced is reduced, so that an effect can be obtained in that the moisture resistance of the apparatus can be improved as compared with the modification shown in FIG. 6.

Figure 10:
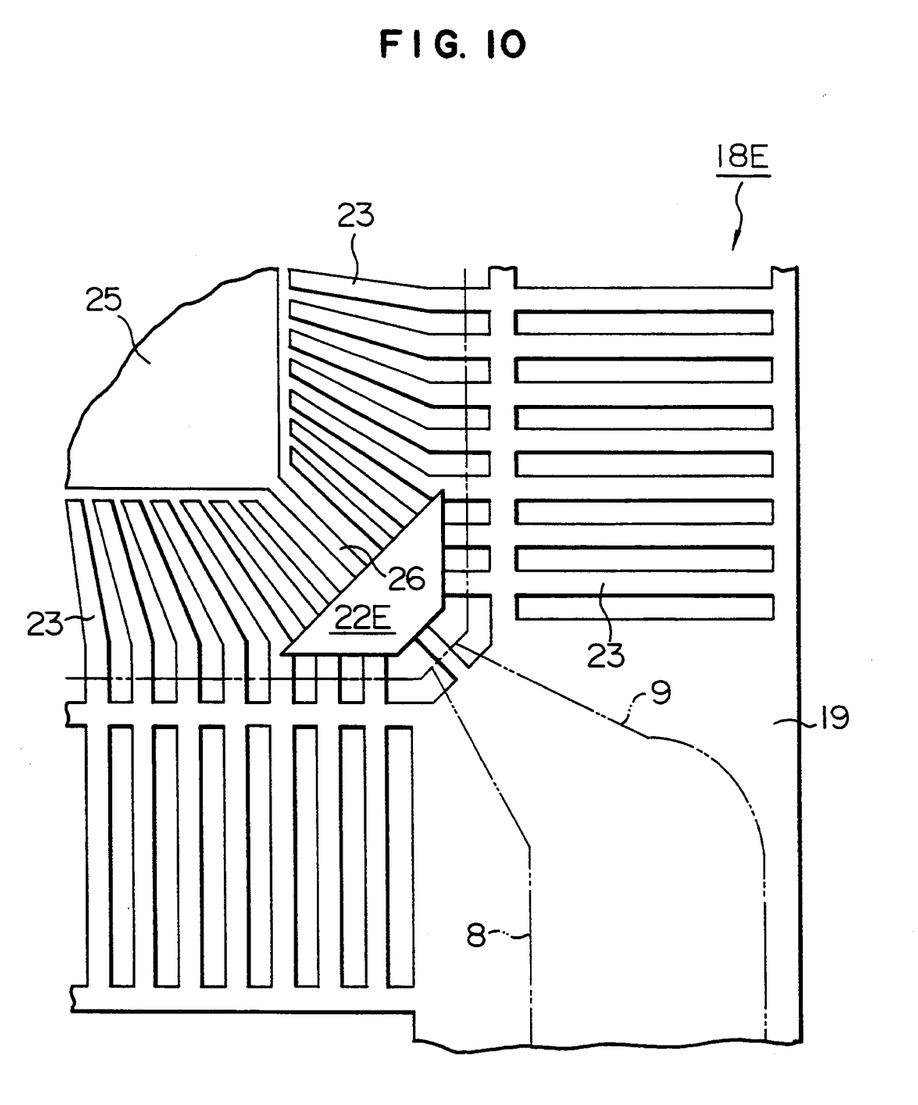
FIG. 10 is a partial view which illustrates another example of the lead frame according to the present invention.

FIG. 10 is an enlarged plan view which illustrates a portion including the gate of the lead frame 1BE as another modification. Leads 23 are disposed in four direction of the rectangular body, four land support leads 26 are diagonally disposed and a land tab 25 is positioned at the center of the four land support leads 26. Since the control plate cannot be provided because the number of the leads is too large in this case, a control tape 22E for controlling the resin flow is applied on the land support lead 26 and a plurality of leads 23 adjacent to the gate 9.

In this modification shown in FIG. 10, even if there is no space in which the control plate can be placed, an effect can be obtained in that the flow of the molding resin can be controlled by using the control tape.

Figure 11:
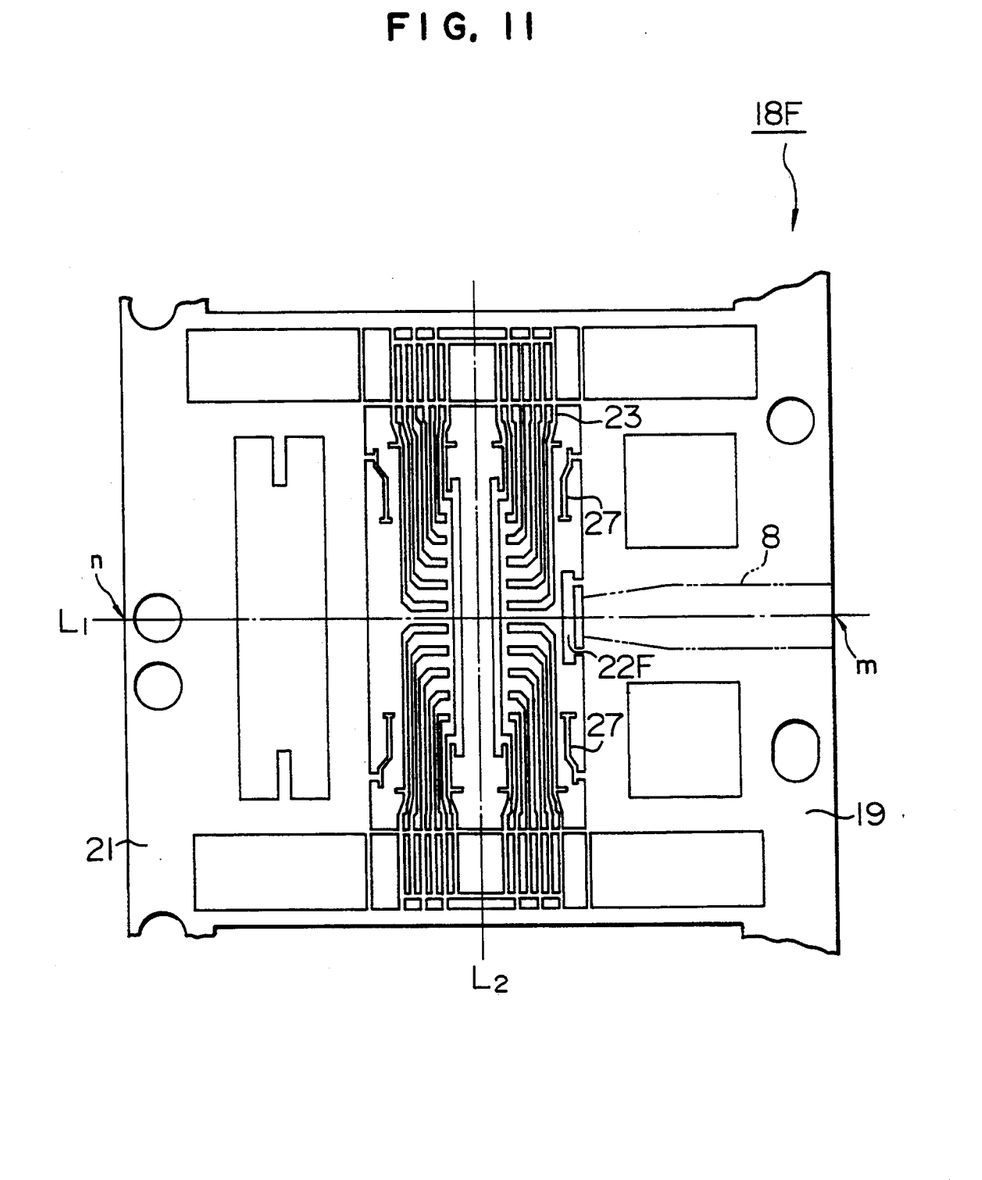
FIG. 11 is a partial view which illustrates another example of the lead frame according to the present invention.

FIG. 11 is a plan view which illustrates a lead frame 18F as another modification. Multiple leads 23 are disposed to project over the short side of the apparatus and a control plate 22F for controlling the flow of the molding resin is projected at a portion adjacent to the gate 9. Furthermore, package suspending leads 27 for maintaining the connection between the base frame 19 and the semiconductor apparatus in a lead bending process to be performed after the molding process are projected over the base frame 19. The lead frame 18F is employed in a very thin semiconductor apparatus called a TSOP (Thin Small Outline Package) TYPE 1.

Then, results of test carried out about the lead frame according to the modification shown in FIG. 11 will now be described. This test was carried out by using a lower plunger type molding apparatus in plate of the upper plunger type molding apparatus shown in FIGS. 1 and 2.

FIG. 11 shows a phantom straight line $L_1$ which indicates the center line of the supply passage 8 and a phantom straight line $L_2$ perpendicular to straight line $L_1$. Assuming that the intersections of straight line $L_1$ and the two side surfaces of the lead frame are m and n, straight line $L_2$ bisects segment $\overline{mn}$. Two phantom regions defined by straight $L_2$ are not axisymmetric because of the presence of the control plate 22F.

Figure 12:
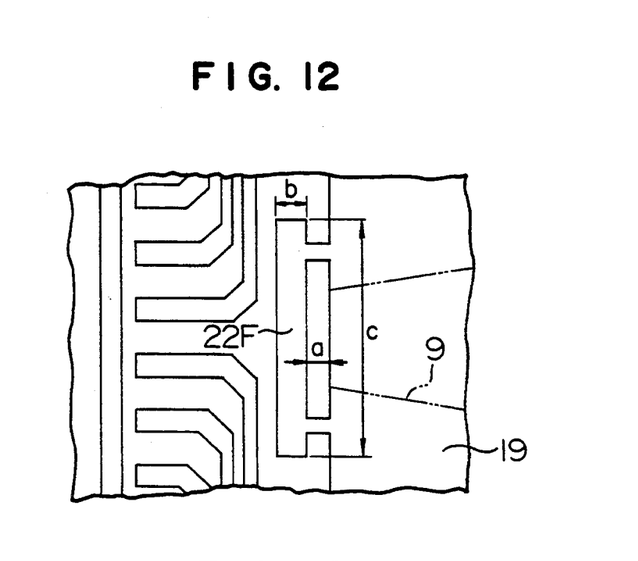
FIG. 12 is an enlarged view which illustrates a portion of the lead frame shown in FIG. 11, that is a portion aligned to a resin supply passage of the mold.

FIG. 12 is an enlarged view which illustrates a portion corresponding to the gate 9. Four types of samples of the control plate 22F were produced while assuming the distance from the base frame 19 was a, the length of the control plate 22F was b and the horizontal width was c. The shapes of the samples of the lead frame is shown in Table 1.

TABLE 1

| | Dimensions of Control Plate | | |
|---|---|---|---|
| | a (mm) | b (mm) | c (mm) |
| I | 0.3 | 0.3 | 0.3 |
| II | 0.3 | 0.3 | 0.6 |
| III | 0.3 | 0.6 | 0.3 |
| IV | 0.3 | 0.6 | 0.6 |

The four patterns of the lead frame I, II, III and IV and a lead frame having no control plate were used in the molding process. The dimensions of the semiconductor apparatus, those of the semiconductor device and the thickness of the lead frame are shown in Table 2.

TABLE 2

| Dimensions except for those of Control Plate | |
|---|---|
| Semiconductor Apparatus | 10.0 × 18.4 × 1.0 |
| Semiconductor Device | 8.14 × 15.57 × 0.28 |
| Thickness of Lead Frame | 0.125 |

Figure 13:
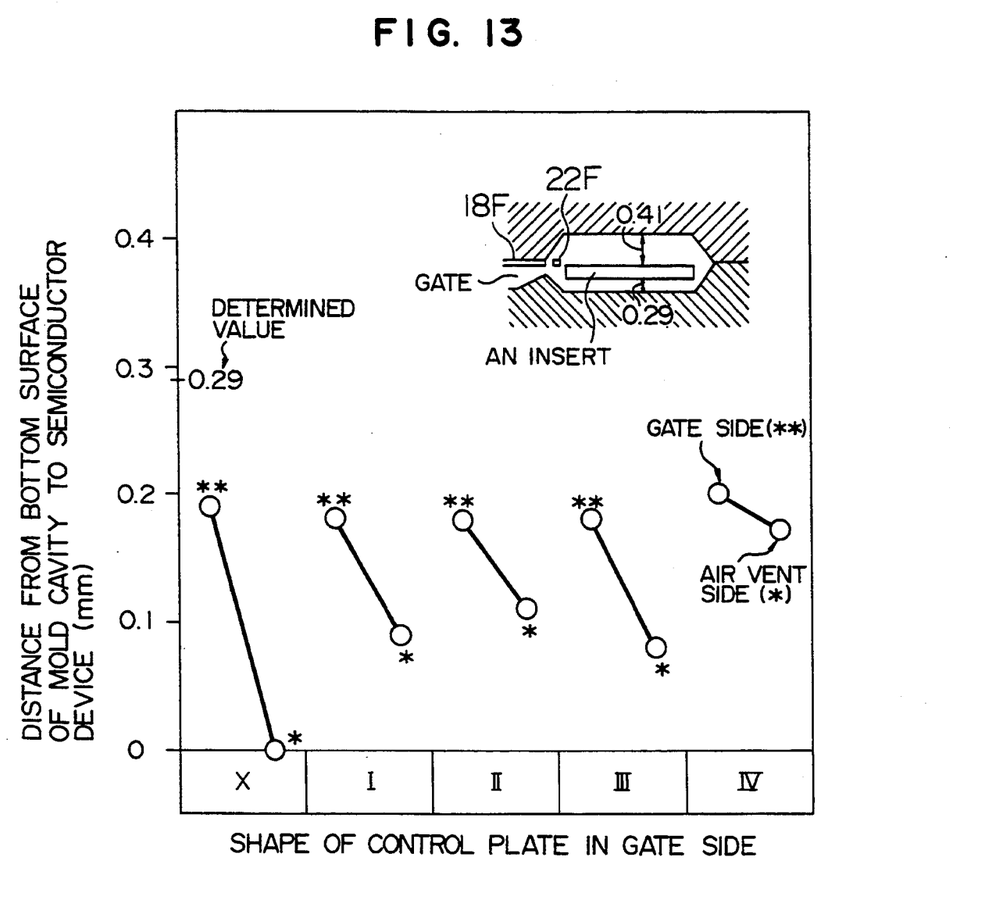
FIG. 13 is a graph which illustrates results of molding tests carried out by using the various lead frames defined by FIG. 12 and Table 1.

FIG. 13 illustrates test results of an evaluation made about biasing of the insert composed of the lead frame and the semiconductor device. The axis of abscissa stands for the shape of the control plate and the axis of ordinate stands for the distance from the bottom surface of the mold cavity to the insert. In a case where the lead frame having no control plate was used (x), the insert appears outside on the lower side of the semiconductor apparatus adjacent to the vent cavity of the mold, that is, the air vent. In a case where each of the lead frames I to IV having the control plate was used, the movement of the insert from the set position toward the lower surface of the apparatus was in an allowable range for preventing the generation of defects. Furthermore, it is apparent that the lead frame IV has the most preferable shape among I to IV for preventing the movement of the insert.

According to each of the aforesaid modifications, a common effect can be obtained in that, even if the upper and the lower resin layers have not substantially the same thickness, the molding resin can be substantially equally charged and thereby the generation of defects in the molding process such as the undesirable movement of the insert and the through void and the like can be prevented.

Although the control plate is provided in only the portion adjacent to the gate of the short side of the apparatus in the aforesaid modifications shown in FIGS. 6 to 9 and 11, it may be provided for the two short sides.

As described above, according to each of the aforesaid modifications, even if the upper and the lower resin layers have not substantially the same thickness, the molding resin can be substantially equally charged and thereby the generation of defects in the molding process such as the undesirable movement of the insert and the through-void and the like can be excluded.

What is claimed is:

1. A method of enclosing a semiconductor device in resin comprising steps of placing a lead frame on which a semiconductor device is mounted between upper and lower mold halves which constitute a mold and injecting, under pressure, resin fluidized with heat into a cavity defined by said two mold halves through a supply passage formed in the mold, so that the upper and the lower surfaces of an insert including said lead frame and said semiconductor device electrically connected to said lead frame with wires are covered with said resin, wherein:

said lead frame has at least one control plate to control the flow of said resin, said control plate is placed in a mold cavity at a position adjacent to an outlet port of said supply passage and formed along a flat surface of said lead frame in a state where said lead frame is placed between said upper and lower mold halves, said control plate being positioned and dimensioned such that the resin substantially equally moves forward in the mold cavity both above the upper surface of the insert and below the lower surface of the insert.

2. A method according to claim 1, wherein said control plate is a projection formed integrally with a base frame of said lead frame.

3. A method according to claim 1, wherein said control plate is at least one projection formed integrally with a land support lead for integrally connecting a land of said lead frame for supporting said semiconductor device and a base frame.

4. A method according to claim 1, wherein said control plate is at least one projection formed integrally with an inner lead placed adjacent to said outlet port of said supply passage.

5. A method according to claim 1, wherein said control plate is a sheet member applied to a plurality of inner leads at a position in the vicinity of said outlet port of said supply passage.

6. A method according to claim 1, wherein said control plate is placed to be biased to either of an upper portion or a lower portion of the mold cavity with respect to an axis of said outlet port of said supply passage, so as to make a flow passing along a surface of a ceiling of said cavity and another flow passing along a surface of a bottom of said cavity to substantially equally move forward, so as to restrict said resin flow at the upper portion or the lower portion to which said control plate is biased, and so as to promote said resin flow at the upper portion or the lower portion to which said control plate is not biased.

7. A method according to claim 6, wherein said control plate is a projection formed integrally with a base frame of said lead frame, and said resin flow is throttled in a portion between said projection and another insert position in said cavity, whereby said resin flow is controlled.

8. A method according to claim 2, wherein a widthwise center line of said control plate is aligned to a widthwise center line of said supply passage.

9. A method according to claim 2, wherein said control plate is connected to said base frame of said lead frame at at least two portions, each of said at least two portions having a smaller width than a width of the control plate, a total width of said at least two portions being less than a total width of the control plate.

10. A method according to claim 1, wherein a width of said control plate is equal to or larger than a width of said outlet port of said supply passage.

11. A method according to claim 6, wherein said insert comprises said semiconductor device, said lead frame on one side of which said semiconductor device is secured, and a plurality of wires electrically connecting the semiconductor device and inner leads of said lead frame with one another on an opposed side of said lead frame, and wherein, when said insert is placed between said upper and lower mold halves, a distance between the upper surface of the insert and a surface of a ceiling of said cavity is greater than a distance between the lower surface of the insert and a bottom surface of said cavity.

12. A method according to claim 11, wherein said semiconductor device is secured to said one side of said lead frame with a double-coated adhesive tape of insulator material.

13. A method according to claim 11, wherein said upper surface of the insert is an uppermost surface to which the wires electrically connecting the semiconductor device and inner leads are secured.

14. A method according to claim 13, wherein a space between said control plate and said insert is a throttle portion of a resin flowing passage for injecting the resin into the cavity.

15. A method according to claim 1, wherein said insert comprises said semiconductor device, said lead frame on one side of which said semiconductor device is secured, and a plurality of wires electrically connecting the semiconductor device and inner leads of said lead frame with one another on an opposed side of said lead frame, and wherein, when said insert is placed between said upper and lower mold halves, a distance between the upper surface of the insert and a surface of a ceiling of said cavity is greater than a distance between the lower surface of the insert and a bottom surface of said cavity.

16. A method according to claim 15, wherein said upper surface of the insert is an uppermost surface to which the wires electrically connecting the semiconductor device and inner leads are secured.

17. A method according to claim 16, wherein a space between said control plate and said insert is a throttle portion of a resin flowing passage for injecting the resin into the cavity.

18. A method according to claim 1, wherein, when said insert is placed between the upper and lower mold halves, a distance between the upper surface of the insert and a surface of a ceiling of said cavity is different than a distance between the lower surface of the insert and a bottom surface of said cavity, whereby a resin layer formed to cover the upper surface of the insert has a different thickness than a resin layer formed to cover the lower surface of the insert.

19. A method according to claim 18, wherein a space between said control plate and said insert is a throttle portion of a resin flowing passage for injecting the resin into the cavity.

20. A method according to claim 1, wherein said control plate is a control tape applied to a plurality of leads of the lead frame.

* * * * *